United States Patent
Hong et al.

(10) Patent No.: US 12,411,411 B2
(45) Date of Patent: Sep. 9, 2025

(54) COVER DEVICE FOR PHOTORESIST CONTAINER

(71) Applicant: SEMICON TECH GLOBAL LIMITED, Seongnam-si (KR)

(72) Inventors: Soon Suk Hong, Seongnam-si (KR); Sun Seock Moon, Yongin-si (KR); Kwon Su Kim, Hwaseong-si (KR); Se Hyun Jang, Yongin-si (KR)

(73) Assignee: SEMICON TECH GLOBAL LIMITED, Seongnam-si (KR)

( * ) Notice: Subject to any disclaimer, the term of this patent is extended or adjusted under 35 U.S.C. 154(b) by 174 days.

(21) Appl. No.: 18/540,887

(22) Filed: Dec. 15, 2023

(65) Prior Publication Data
US 2024/0361694 A1    Oct. 31, 2024

(30) Foreign Application Priority Data

Apr. 28, 2023    (KR) .................. 10-2023-0056524

(51) Int. Cl.
*G03F 7/16*    (2006.01)
*B65D 47/06*    (2006.01)
*B65D 47/32*    (2006.01)

(52) U.S. Cl.
CPC .............. *G03F 7/16* (2013.01); *B65D 47/06* (2013.01); *B65D 47/32* (2013.01)

(58) Field of Classification Search
CPC ............ B65D 47/06; B65D 47/32; G03F 7/16
USPC ............ 220/200, 234–238, 239; 222/402.21; 285/148.28
See application file for complete search history.

(56) References Cited

U.S. PATENT DOCUMENTS

| 5,083,683 A | * | 1/1992 | Knickerbocker ... B05B 11/0037 222/464.7 |
| 5,586,589 A | * | 12/1996 | Voelker .................. B67D 7/344 141/DIG. 1 |

FOREIGN PATENT DOCUMENTS

| JP | 2016-159981 A | 9/2016 |
| KR | 10-2004-0017479 A | 2/2004 |
| KR | 10-1350282 B1 | 1/2014 |
| KR | 10-2023-0028085 A | 2/2023 |

* cited by examiner

*Primary Examiner* — Timothy L Maust
(74) *Attorney, Agent, or Firm* — Revolution IP, PLLC

(57) ABSTRACT

A cover device includes a guide module which is coupled to an upper end portion of the container, has an upward inclination at a predetermined angle, has an inclined protruding unit that protrudes, and is formed with a communication port through which the inside and the outside of the housing space communicate; a discharge module in which one side along a longitudinal direction penetrates the communication port and is disposed inside the container, the other side is exposed to the outside to form a discharge port, and an intermediate portion along the longitudinal direction has an expansion fixing unit which is expanded, at least a part of periphery is in contact with an inner surface of the communication port, and is inserted and fixed; and a fixing module which is fixedly coupled to the inclined protruding unit in a state in which the other part of the discharge module penetrates.

10 Claims, 7 Drawing Sheets

COVER DEVICE FOR PHOTORESIST CONTAINER

CROSS-REFERENCE TO RELATED APPLICATION

This application claims under 35 U.S.C. § 119(a) the benefit of Korean Patent Application No. 10-2023-0056524 filed on Apr. 28, 2023, the disclosure of which is incorporated herein by reference in its entirety.

BACKGROUND

(a) Technical Field

The present invention relates to a cover device for a photoresist container, which is coupled to a container into which a gas is injected to discharge a photoresist aqueous solution inside, and prevents unintentional separation due to a pressure.

(b) Background Art

In general, a photolithography process includes a process of positioning a wafer, which has undergone a series of semiconductor manufacturing processes, on a spin chuck of a coating device and coating it with a photoresist.

Here, the photoresist includes a resin, an inhibitor as a sensitizer activated by light, and a solvent of a liquid state. The photoresist supplied to the photoresist supply line is supplied to a photoresist supply line through a photoresist supply pipe (Teflon tube) coupled to a container cap while being housed in the container, and the photoresist thus supplied to photoresist supply line is supplied to a coating device via a plurality of valves and an intermediate tank.

Here, a container for supplying the photoresist aqueous solution and a cover device combined thereto are used, and configured to supply a high-pressure gas into the container and discharge the photoresist aqueous solution therein and transfer it to the supply pipe.

At this time, the container is provided with a cover device for discharging the photoresist aqueous solution and for supplying high-pressure gas to the inside of the container. However, because the inside of the container is maintained in a high-pressure state, a problem arises that a part of the cover device is separated.

In particular, if a part of the cover device is unintentionally separated, the user may be shot by the separated part, or the photoresist aqueous solution inside may be partially scattered on the user's body, causing a safety accident.

Therefore, a development of technique for solving such these problems is necessary.

PRIOR ART DOCUMENTS

Patent Document (Patent Document 1) Korean Laid-open Patent Publication No. 10-2004-0017479

SUMMARY OF THE INVENTION

The present invention was devised to solve the above-described problems of the related art, and object thereof is to provide a cover device for a photoresist container that is coupled to a container for injecting a gas at high pressure and discharging a photoresist aqueous solution therein, and enables the gas to be discharged, when the cover device is partially separated due to pressure.

The objects of the present invention are not limited to the above objects, and other objects not mentioned will be clearly understood by those skilled in the art from the following description.

The present invention to achieve the above object relates to a cover device which is coupled to an opening portion of a container in which a photoresist aqueous solution is housed to seal the inside and simultaneously discharge the photoresist aqueous solution to the outside, the cover device including: a guide module which is coupled to an upper end portion of the container, has an upward inclination at a predetermined angle, has an inclined protruding unit that protrudes, and is formed with a communication port through which the inside and the outside of the housing space communicate; a discharge module which is formed in a long pipe shape, and in which one side along a longitudinal direction penetrates the communication port and is disposed inside the container, the other side is exposed to the outside to form a discharge port, and an intermediate portion along the longitudinal direction has an expansion fixing unit which is formed to expand, is in contact with an inner surface of the communication port on at least a part of periphery, and is inserted and fixed; and a fixing module which is fixedly coupled to the inclined protruding unit in a state in which the other part of the discharge module penetrates, and is formed so that the discharge module is pressed toward the guide module, wherein the communication port is formed to have an inner diameter that decreases toward the inside of the container in at least a partial region and is fixed by pressing.

In addition, the discharge module may further include a channel unit which is formed long, has a part disposed inside the container, and has a discharge channel formed therein, and a connecting unit which protrudes to extend from the expansion fixing unit, is exposed to outside, and has a discharge port extending with the discharge channel.

Also, the inclined protruding unit may further include a protrusion pressing part formed in at least a part along the inner surface of the communication port, protrudes toward the center, and comes into contact with the expansion fixing unit.

Also, the protrusion pressing part may be formed with a first inclined surface that protrudes at a predetermined angle along the longitudinal direction.

Further, the inclined protruding unit may be formed with a second inclined surface, which is continuous with the first inclined surface and is inclined in an opposite direction inside the communication hole, and may have a relatively larger inclination angle than the first inclined surface.

In addition, the inclined protruding unit may further include a decompression part which is formed in at least a part along the periphery, and when the expansion fixing unit is pushed out from the inside of the communication port by a preset length or more and slides toward the connecting unit, discharges the gas inside the container to the outside.

Also, the decompression part may be formed in a hole shape through which inside and outside communicate in at least a part along the periphery of the communication port, and may be formed to be opened when the expansion fixing unit moves rearward.

Also, the decompression part may be formed in a slit shape at an upper end portion of the inclined protruding unit, and opened when the expansion fixing unit moves rearward.

In addition, the fixing module may include a coupling unit through which the connecting unit penetrates, which wraps around and fixes the inclined protrusion in a state of being in contact with the expansion fixing unit, and has an annular letch formed on the upper end of an outer surface; and an adjusting unit which is rotatably coupled to an outer peripheral surface of the coupling unit, has a plurality of elastic pieces formed to correspond to the letch to rotate the coupling unit within a preset level, and adjusts the expansion fixing unit to be pressed toward the container.

In addition, the fixing module may include a coupling unit, through which the other part of the discharge module penetrates, and which surrounds at least a part of the inclined protruding unit in a state of being in contact with the expansion fixing unit; and an adjusting unit which has a fixed length, and an intermediate portion fixed to the coupling unit, and in which one side along the longitudinal direction selectively comes into contact with the inclined protruding unit to adjust coupling with the coupling unit, wherein the adjusting unit is operated to press the expansion fixing unit in the direction of the container, and the expansion fixing unit may be prevented from being detached in the opposite direction.

In addition, the inclined protrusion unit may include a serrated locking protrusion on at least a part of the outer surface, and a plurality of protrusions are continuously formed along the protruding longitudinal direction, and the adjusting unit may be coupled to at least a part of the locking protrusion and be selectively fixed.

The cover device for photoresist container of the present invention for solving the above problems has the following effects.

The cover device according to the present invention includes a guide module having a protruding communication port, a discharge module which penetrates the communication port to discharge the photoresist aqueous solution to the outside, and a fixing module which maintains a coupling between the discharge module and the guide module. The discharge module is inserted and fixed into the container, and an inner diameter of the communication port is configured to decrease along the longitudinal direction, so that the expansion fixing unit can be stably fixed and sealed as it is pressed toward the communication port.

The effects of the present invention are not limited to the effects described above, and other effects not mentioned will be clearly understood by those skilled in the art from the description of the claims.

DETAILED DESCRIPTION

Figure 1:
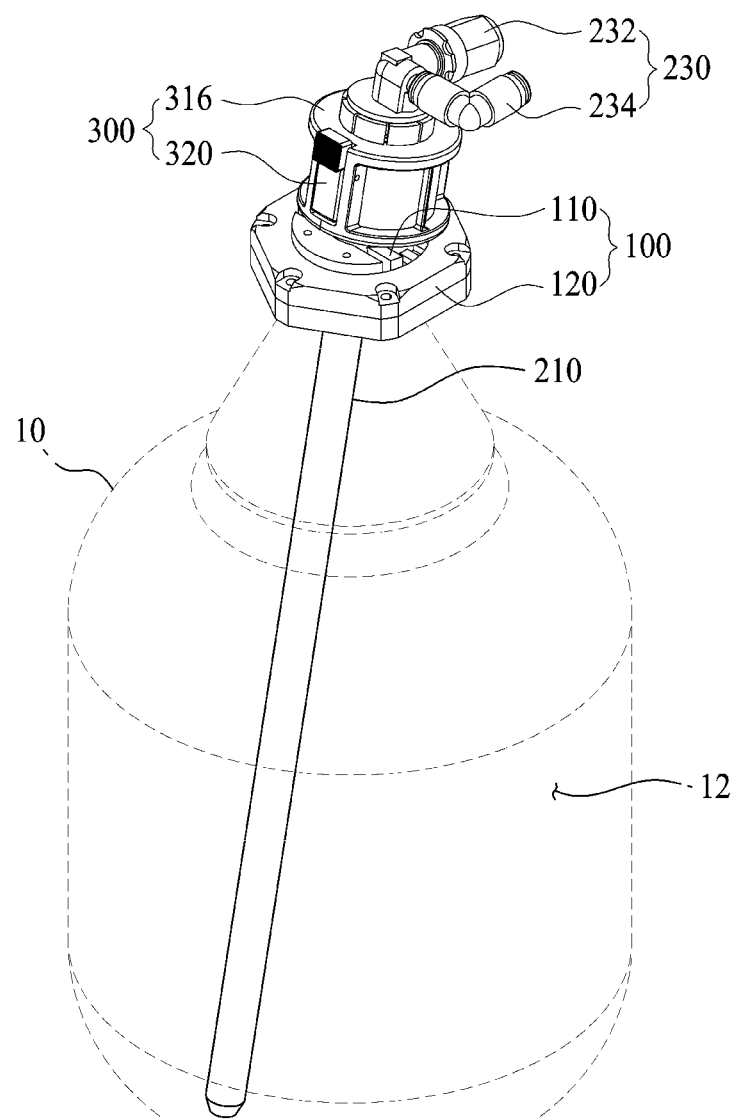
FIG. 1 is a perspective view of a cover device for a photoresist container according to the present invention.

Preferred embodiments of the present invention, which can specifically achieve the object of the present invention, will be described below with reference to the accompanying drawings. In describing this embodiment, the same names and the same reference numerals are used for the same configurations, and the additional description associated therewith will be omitted.

In addition, in describing the embodiments of the present invention, it will be clarified in advance that the components having the same functions use only the same names and the same reference numerals, but are not substantially the same as the conventional ones.

Moreover, the terms used in the embodiments of the present invention are merely used to describe particular embodiments and are not intended to be limiting of the present invention. Singular expressions include plural expressions unless they are clearly different contextually.

Further, it is to be understood that, in the embodiments of the present invention, terms such as "including" or "having" are intended to specify the presence of the features, numbers, steps, operations, constituent elements, components or combinations thereof described herein, but do not preclude the presence or the possibility of addition of other features, numbers, steps, operations, constituent elements, components, or combinations thereof.

FIG. 1 is a diagram showing an external form of a cosmetic case according to the present invention.

First, a cover device for a photoresist container 10 according to the present invention will be schematically described below with reference to FIGS. 1 to 4.

Figure 2:
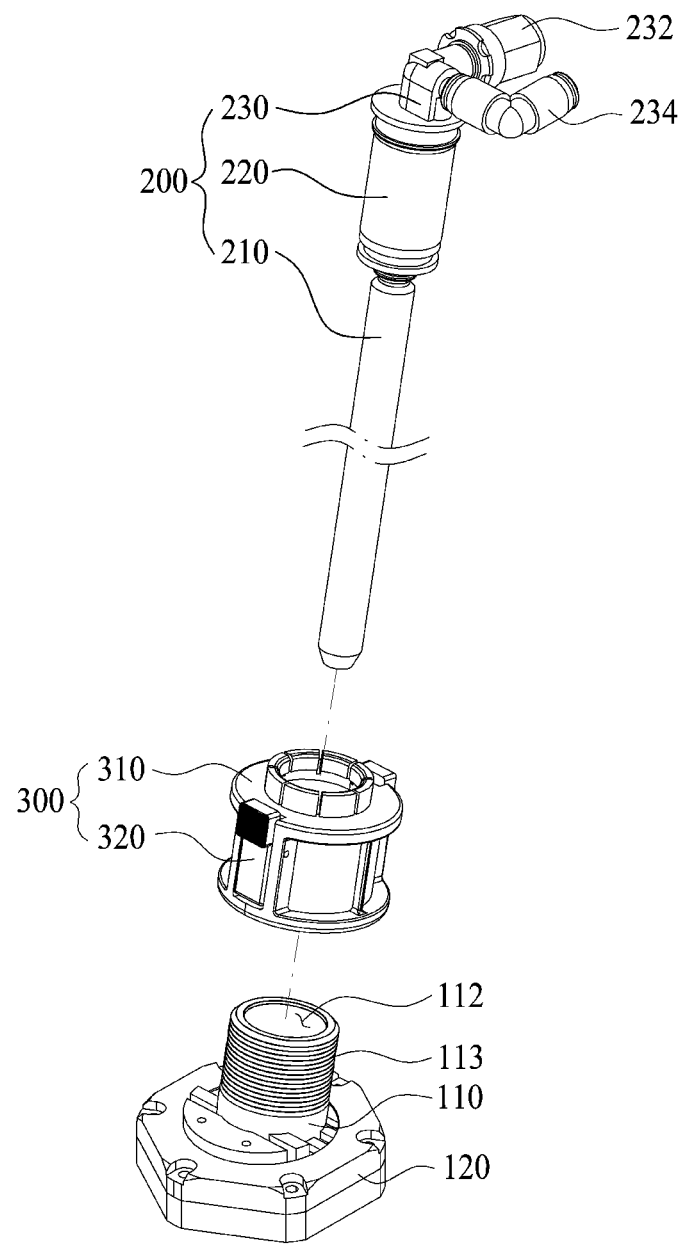
FIG. 2 is an exploded perspective view showing a detailed configuration of the cover device for the photoresist container according to the present invention.

FIG. 1 is a perspective view of the cover device for the photoresist container 10 of the present invention, and FIG. 2 is an exploded perspective view showing the detailed configuration of the cover device for the photoresist container 10 of the present invention.

Figure 3:
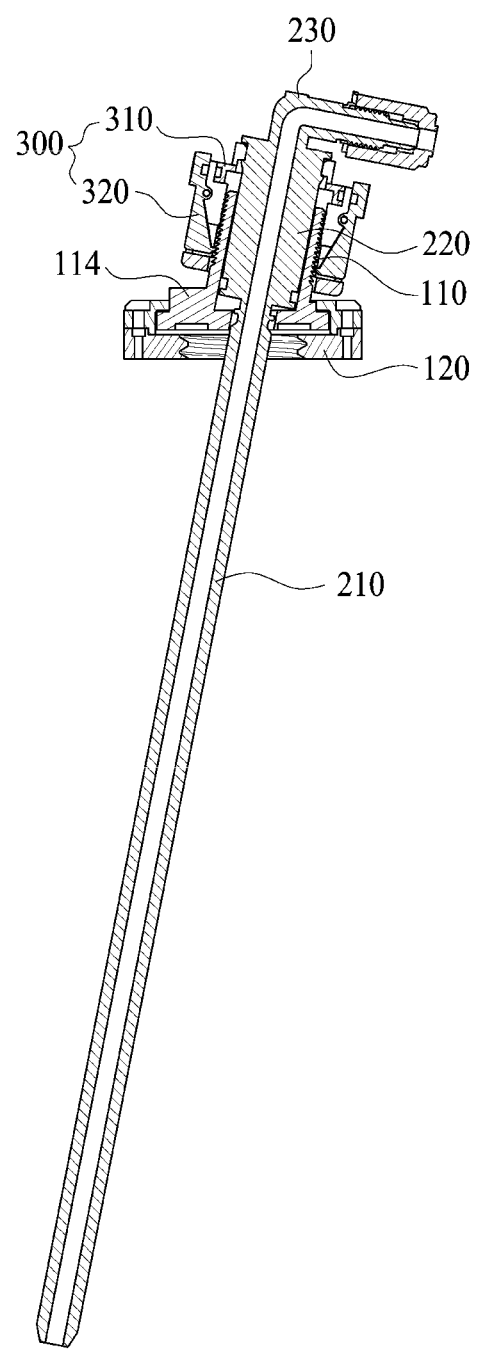
FIG. 3 is a cross-sectional view showing an internal structure of the cover device for the photoresist container of the present invention.
Figure 4A:
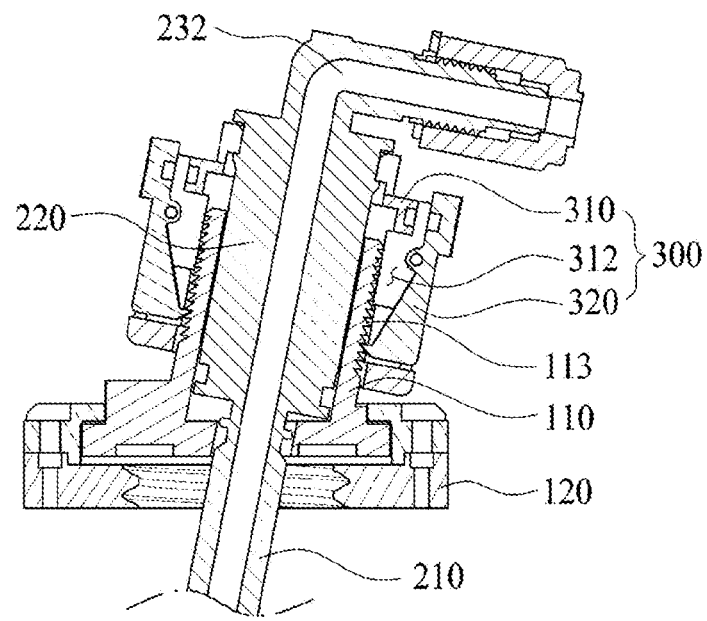
FIGS. 4A and 4B are plan views showing a configuration of a fixing module in the cover device for the photoresist container of FIG. 1.
Figure 4B:
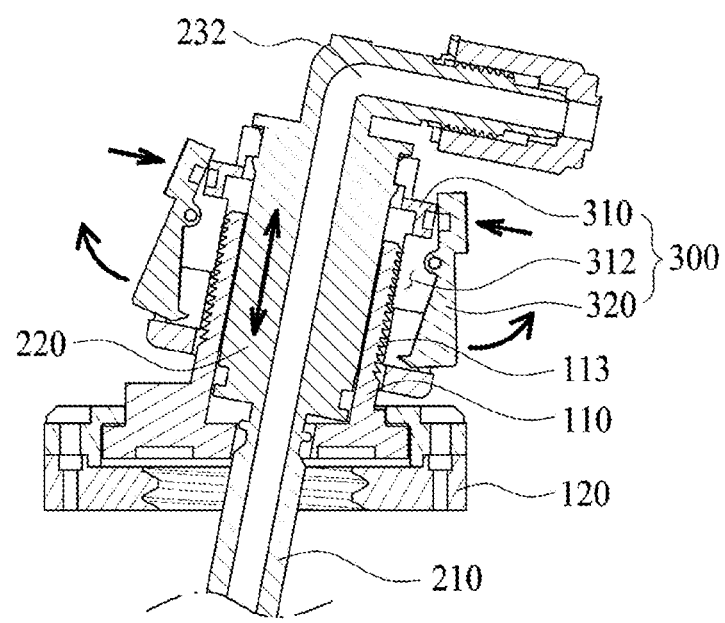

FIG. 3 is a cross-sectional view showing an internal structure of the cover device for the photoresist container 10 of the present invention, and FIGS. 4A and 4B are plan views showing a configuration of a fixing module 300 in the cover device for the photoresist container 10 of FIG. 1.

The cover device of the photoresist container 10 according to the present invention is sealed by being coupled to an upper part of the container 10 in which the photoresist aqueous solution is contained, and simultaneously a separate high-pressure gas is introduced from the outside, and the photoresist aqueous solution is supplied to the outside by the pressure accordingly.

Referring to the shown drawings, the cover device according to the present invention roughly includes a guide module 100, a discharge module 200 and a fixing module 300, and the guide module 100 is coupled to an opened portion of the container 10 to seal the inside of the housing space 12, and simultaneously enables the photoresist aqueous solution to be discharged to the outside through a separate communication port 112.

Here, at least a part of the container 10 is formed to extend upward, is formed to protrude while having an upward inclination at a preset angle, and is coupled to the fixing module 300, which will be described below.

Specifically, the guide module 100 includes an inclined protruding unit 110 that is disposed at the open upper end of the container 10 and protrudes with an upward inclination, and a cover unit 120 fixedly coupled to the container 10 in the state of being connected to the cover unit 120.

The inclined protruding unit 110 is made of synthetic resin, is formed in a pipe shape, has a form protruding by a certain length, and has a communication port 112 communicating with the container 10 formed therein. At this time, the inclined protruding unit 110 includes serrated locking protrusions 113 on at least a part of the outer surface thereof, a plurality of protrusions 113 are continuously formed along a protruding longitudinal direction, and the fixing module 300, which will be described below is combined thereto.

The inclined protruding unit 110 has a lower end portion is formed to be able to make sealing contact corresponding to the shape of the opening of the container 10, and at least a portion of the inclined protruding unit 110 is coupled to the cover unit 120.

In this embodiment, the inclined protruding unit 110 has a T-shape as shown, has an extended part 114 having an extended periphery at its lower end, and has a form protruding long in the upward direction. At this time, the communication port 112 is elongated in a vertical direction and communicates with the inside of the container 10.

In addition, the cover unit 120 is configured to maintain a combined state without detaching in the state in which the inclined protruding unit 110 and the container 10 are in contact with each other, and is fixedly coupled to the opening in the state of being connected to the extended part 114.

Specifically, the cover unit 120 is formed in a ring shape, through which the inclined protruding unit 110 penetrates, at least a part of which wraps around the extended part 114, and is coupled to the container 10. At this time, separate screw threads are formed on the container 10, and the lower side of the cover unit 120 wraps around the container 10 and is screwed and fixed to the screw threads.

Here, the cover unit 120 has a ring-shaped central hole through which a part of the inclined protruding unit 110 penetrates, but the hole is relatively smaller than the extended part 114. Accordingly, when the cover unit 120 is coupled to the container 10, the inclined protruding unit 110 can maintain the combined state without being detached.

In this embodiment, the cover unit 120 is formed of two members that are stacked in the vertical direction, the extended part 114 is disposed between the members, and the cover unit 120 and the inclined protruding unit 110 can maintain the combined state.

In this way, the guide module 100 includes the inclined protruding unit 110 and the cover unit 120, is fixedly coupled to the opening of the container 10, and allows the inclined protruding unit 110 to be disposed while protruding upward at a preset angle.

Additionally, the inclined protruding unit 110 according to the present invention has a separate protrusion pressing part 130 formed along the inner surface of the communication hole 112, and a part of the discharge module 200 is inserted into the communication hole 112 and pressed by the protrusion pressing part 130.

A detailed configuration of the protrusion pressing part 130 will be described below with reference to FIG. 5.

On the other hand, the discharge module 200 is formed in a long pipe shape, passes through the communication port 112, has one side inserted into the housing space 12 of the container 10, and the other side exposed to the outside to form a discharge port 232.

Specifically, the discharge module 200 is combined and fixed in a state of passing through the guide module 100, one side is disposed in the housing space 12, and the other side is disposed outside the container 10 to discharge the contained photoresist aqueous solution to the outside.

At this time, when the discharge module 200 is coupled to the guide module 100, the discharge module 200 is tightly fixed and inserted to form a discharge channel and an air channel, and the discharge channel is configured to abut on the bottom surface of the housing space 12 and discharge the photoresist aqueous solution to the outside. The rest of the air channel communicates with the upper portion of the housing space 12 and is supplied with a high-pressure gas so that the photoresist aqueous solution can be discharged to the outside by pressure.

In the present invention, a part of the discharge module 200 has a periphery corresponding to the periphery of the communication port 112 along the longitudinal direction, and the discharge module 200 is inserted into the inner surface of the communication port 112, and roughly includes a channel unit 210, an expansion fixing unit 220 and a connecting unit 230.

The channel unit 210 is formed long, and a part thereof is disposed inside the container 10, and a discharge channel is formed therein to discharge the photoresist aqueous solution to the other side.

Specifically, the channel unit 210 is formed long in a general pipe form, and is disposed so that one side is in contact with the bottom surface of the container 10. At this time, as shown, the channel unit 210 is disposed in a state of being inclined at a certain angle by the guide module 100, and is seated so that one side is in contact with the edge portion of the bottom surface in the housing space 12 to completely discharge the remaining photoresist aqueous solution.

In this embodiment, the channel unit 210 is formed long and relatively narrower than the opening of the container 10, and a discharge channel is formed inside.

On the other hand, the expansion fixing unit 220 is formed to extend to the other side of the channel unit 210 and is configured to be inserted and fixed into the communication port 112 so that a partial region along the longitudinal direction of the channel unit 210 is expanded, and the discharge channel is formed to extend inside.

Specifically, the expansion fixing unit 220 preferably has a periphery and a length corresponding to the periphery of the communication port 112, and is inserted through the communication port 112 when inserting the channel unit 210, and is configured to seal the communication port 112.

At this time, the expansion fixing unit 220 has an air channel separate from the discharge channel, and is connected to the connecting unit 230 to be described later to supply high-pressure air to the inside of the housing space 12.

In this embodiment, the expansion fixing unit 220 is formed in a cylindrical shape corresponding to the shape of the communication port 112, and is provided with at least one or more sealing along the periphery to prevent unintentional flowing of fluid when coming into contact with the communication port 112.

Here, the expansion fixing unit 220 is configured so that the protrusion pressing part 130 to be described below comes into contact with the side surface along the periphery and is pressurized in a tightening manner when inserted into the communication port 112 to maintain the combined state stably.

On the other hand, the connecting unit 230 is provided on the other side of the channel unit 210 with the expansion fixing unit 220 at the center, and is formed so that the air channel and the discharge channel are independently connected.

More specifically, the connecting unit 230 extends and protrudes from the expansion fixing unit 220 to be exposed to the outside as shown, and includes a discharge port 232 connected to the discharge channel, and a supply part 234 connected to the air channel. At this time, the discharge port 232 is connected to a device for supplying the photoresist aqueous solution, the supply part 234 is connected to means for supplying high-pressure air supplied into the housing space 12, and a nitrogen gas is supplied as the high-pressure air in this embodiment.

In this embodiment, the connecting unit 230 is configured to pass through the fixing module 300 to be described below and exposed to the outside as shown, and the discharge port 232 and the supply portion 234 are provided independently.

In this way, the discharge module 200 includes the channel unit 210, the expansion fixing unit 220 and the connecting unit 230, and the expansion fixing unit 220 is coupled to communication port 112 with one side penetrating the guide module 100.

On the other hand, the fixing module 300 is fixedly coupled to the inclined protruding unit 110 with the other part of the discharge module 200 penetrating therethrough so that the discharge module 200 is pressed toward the guide module 100.

Specifically, the fixing module 300 is configured to wrap a part of the other side of the discharge module 200 and simultaneously be fixedly coupled to the inclined protruding unit 110 to press the expansion fixing unit 220.

At this time, the fixing module 300 is formed in the shape of a ring in which a hole relatively smaller in size than the periphery of the expansion fixing unit 220 is formed at the center of the upper end of the fixing module 300, the connecting unit 230 is configured to pass therethrough, and the fixing module 300 is formed to wrap the outer surface of the inclined protruding unit 110.

In addition, the inclined protruding unit 110 includes a serrated locking protrusion 113 on at least a part of the outer surface thereof, a plurality of protrusions 113 are continuously formed along the protruding longitudinal direction, the fixing module 330 wraps around the inclined protruding unit 110, and at least a part thereof is configured to be in selectively contact with and be fixed to the locking protrusion 113.

As a result, the fixing module 300 moves along the longitudinal direction of the inclined protruding unit 110 toward the container 10, and is fixed to the locking protrusion 113 during movement, thereby preventing the fixing module 300 from unintentionally detaching, and the expansion fixing unit 220 can be pressed into the communication port 112 to maintain the combined state.

Here, the inclined protruding unit 110 according to the present invention is formed such that the inner diameter decreases along the direction of the container 10 in at least a partial region of the communication port 112. When the fixing module 300 presses the expansion fixing unit 220 into the communication port 112, the expansion fixing unit 220 is pressed along the direction in which the inner diameter of the communication port 112 decreases, and the communication port 112 can be stably sealed.

In this embodiment, the fixing module 300 roughly includes a coupling unit 310 and an adjusting unit 320, and the coupling unit 310 is configured to wrap around the outer surface of the inclined protruding unit 110 and press the expansion fixing unit 220.

Specifically, the coupling unit 310 is penetrated by the connecting unit 230, wraps around and fixes the inclined protruding unit 110 while being in contact with the expansion fixing unit 220, and is fixed to the inclined protruding unit 110 by the adjusting unit 320.

Here, as shown in FIGS. 4A and 4B, the coupling unit 310 has a cylindrical shape with a constant thickness, an upper part thereof is formed to have a relatively small inner diameter, and wraps the expansion fixing unit 220 to prevent from escaping upward in the state in which the channel unit 210 penetrates.

And, it is coupled to wrap the upper end portion of the inclined protruding unit 110, and is configured so that the position can be adjusted toward the container 10.

That is, the coupling unit 310 is coupled to the inclination protruding unit 110 in the form that wraps the expansion fixing unit 220 from above while the discharge module 200 is inserted through the inclination protruding unit 110, to prevent detachment of the discharge unit 200 and simultaneously adjust the depth of insertion.

At this time, the coupling unit 310 is configured to be coupled to the adjusting unit 320 to be described later, and selectively fixed or separated from the inclined protruding unit 110 through adjustment of the adjusting unit 320.

In this embodiment, the coupling unit 310 has a cylindrical shape as shown, and a coupling groove 312 is formed through a part of the side surface along the periphery, a part of the outer surface of the inclined protruding unit 110 is exposed, the adjusting unit 320 is coupled to the coupling groove 312 to be in selectively contact with and fixed to the outer surface of the inclined protruding unit 110.

On the other hand, the adjusting unit 320 is provided on the coupling unit 310 to selectively adjust the movement of the coupling unit 310, has a certain length, and is fixed to the coupling unit 310 at its intermediate portion. One side along the longitudinal direction comes into selectively contact with the inclined protruding unit 110 to adjust whether it is coupled to the coupling unit 310.

At this time, the adjusting unit 320 prevents the expansion fixing unit 220 from being unintentionally separated in the opposite direction while the expansion fixing unit 220 is pushed toward the container 10, and selectively separate the coupling unit 310 by the user's operation.

Specifically, at least one or more adjusting units 320 are provided along the periphery of the coupling unit 310, and is disposed vertically while being seated in the coupling groove 312, and the intermediate portion along the longitudinal direction is rotatably coupled to the coupling unit 310. One end portion along the longitudinal direction is formed to correspond to the shape of the locking protrusion 113 and is selectively brought into contact therewith. Here, one end portion along the longitudinal direction of the adjusting unit 320 has at least one or more teeth, and is coupled to at least a part in the region of the locking protrusion 113 exposed through the coupling groove 312 to fix the coupling unit 310.

As a result, when one side of the adjusting unit 320 along the longitudinal direction comes into contact with the locking protrusion 113, the coupling unit 310 moves toward the container 10 or can remain a coupled state, without detaching from the inclined protruding unit 110.

In contrast, as shown in FIGS. 4A and 4B, when the other side of the adjusting unit 320 is pushed to separate one side from the locking protrusion 113, the coupling unit 310 can be in a state of being separable from the inclined protruding unit 110.

In this embodiment, a plurality of adjusting units 320 are disposed along the periphery of the coupling unit 310 at regular intervals, and when the user presses and operates the other side of the adjusting unit 320 at the same time, one side can be maintained selectively in a state of being separated from or in contact with the locking protrusion 113.

At this time, the adjusting unit 320 is configured such that the intermediate portion along the longitudinal direction rotates around the coupling unit 310 with a rotating axis, and is configured such that a restoring force pressed toward the inclined protruding unit 110 acts on one side. That is, the adjusting unit 320 is rotatably coupled to the coupling unit 310 and is provided with a restoring force through a separate elastic member (not shown), so that one side may maintain a contact state with the locking protrusion 113 when the user does not press the other side.

Thus, the fixing module 300 according to the present invention includes the coupling unit 310 and the adjusting unit 320. When the user presses the coupling unit 310 toward the containing container 10 in the state of being coupled to the inclined protruding unit 110 to move the expansion fixing unit 220 and the channel unit 210 together toward the containing container 10, the lower end portion of the channel unit 210 can be disposed close to the bottom surface of the containing container 10.

That is, the fixing module 300 is pressed and fixed by the coupling unit 310 in a state in which the discharge module 200 penetrates the communication port 112, and when the coupling unit 310 presses the discharge module 200 toward the container 10, the locking protrusion 113 and one side of the adjusting unit 320 are brought into contact with each other to adjust the insertion depth step by step. Accordingly, the discharge module 200 can be prevented from being inserted into the container 10 above a certain level.

As described above, the cover device according to the present invention includes the guide module 100, the discharge module 200 and the fixing module 300, the discharge module 200 is inserted and fixed into the container 10, and the inner diameter of the communication port 112 is configured to decrease along the longitudinal direction. Accordingly, the fixing and sealing can be stably performed as the expansion fixing unit 220 is pressed toward the communication port 112.

Next, with reference to FIGS. 5 to 7, the detailed configuration of the inclined protruding unit 110 according to the present invention will be described as follows.

Figure 5:
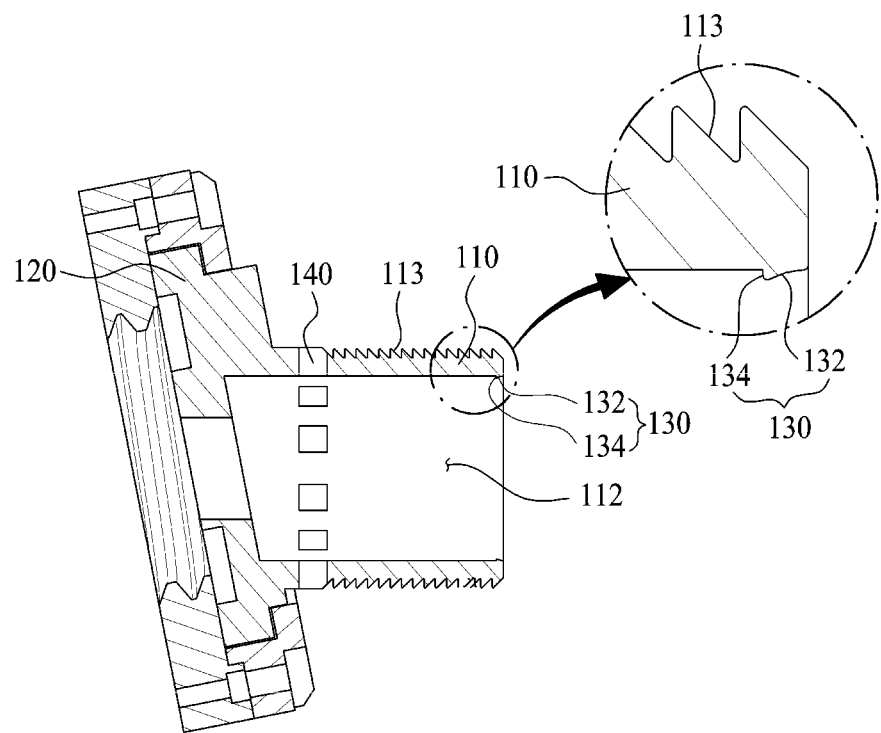
FIG. 5 is a diagram showing a detailed configuration of a communication port in the cover device for the photoresist container of FIG. 1.
Figure 6A:
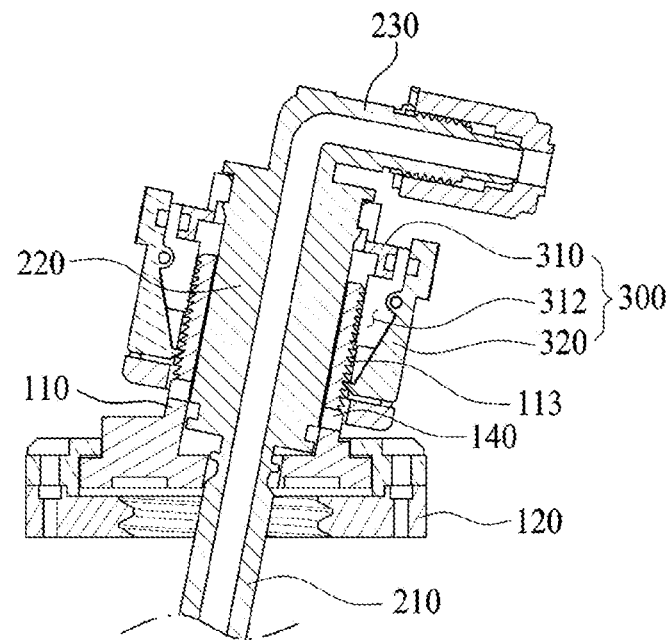
FIGS. 6A and 6B are diagrams showing a configuration of a depressurization unit in the cover device for the photoresist container of FIG. 1.
Figure 6B:
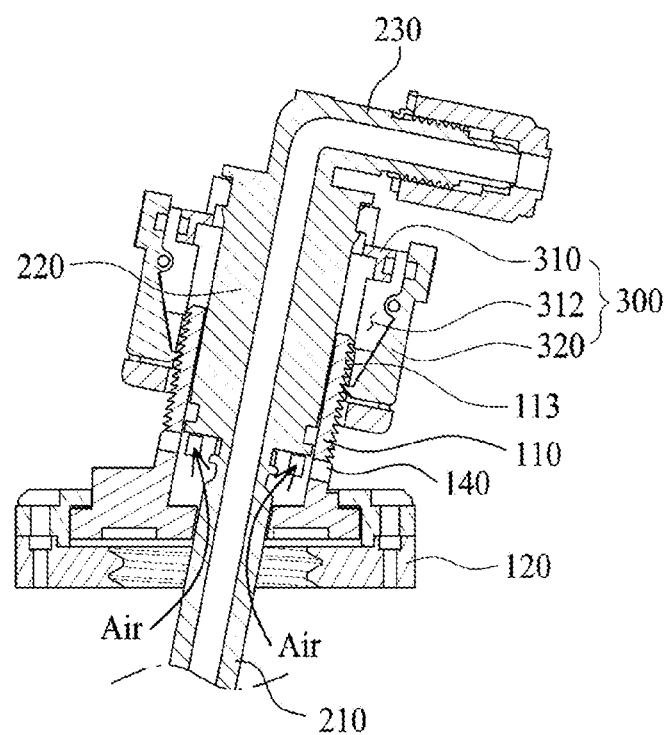
Figure 7:
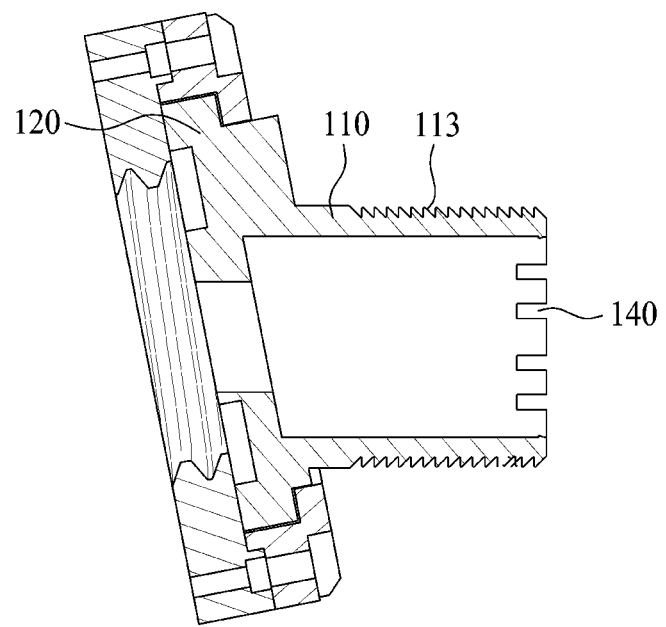
FIG. 7 is a diagram showing a modified form of the depressurization unit in the cover device for the photoresist container of FIG. 1.

FIG. 5 is a diagram showing the detailed configuration of the communication port 112 in the cover device of the photoresist container 10 of FIG. 1, FIGS. 6A and 6B are diagrams showing the configuration of the decompression unit 140 in the cover device of the photoresist container 10 of FIG. 1, and FIG. 7 is a diagram showing a modified form of the decompression unit 140 in the cover device of the photoresist container 10 of FIG. 1.

First, referring to the drawings, the inclined protruding unit 110 has a pipe-shaped communication hole 112 formed at the center, and further includes a protrusion pressing part 130 that protrudes toward the center along the inner surface of the communication hole 112 and makes contact with the expansion fixing unit 220, and a decompression part 140 that discharges the air inside the housing space 12 to the outside at the time of an emergency.

The protrusion pressing part 130 is formed in a general protrusion shape or ring shape, and is configured such that the inner diameter decreases along the longitudinal direction of the communication port 112. Here, when the expansion fixing unit 220 is inserted, the protrusion pressing part 130 is configured to press the side surface to suppress the detachment, and the pressing strength of the side surface also increases, as the expansion fixing unit 220 is pressed and inserted.

As a result, as the fixing module 300 presses the expansion fixing unit 220 toward the communication port 112, the protrusion pressing part 130 can also press the side surface of the expansion fixing unit 220 to suppress the detachment as much as possible.

In this embodiment, the protrusion pressing part 130 is formed in a ring shape as shown and is formed on the inner surface of at least a part of the communication port 112, and includes a first inclined surface 132 that is formed to protrude along the longitudinal direction at a certain angle, and a second inclined surface 134 which is contiguous with the first inclined surface 132 and has as inclination in the opposite direction.

The first inclined surface 132 is formed on the inner surface of the communication port 112 at a preset angle so that the inner surface gradually decreases along the longitudinal direction, and the second inclined surface 134 is configured to have an inclination in the opposite direction to the second inclined surface 134. At this time, the second inclined surface 134 is configured to have a relatively larger inclination angle than the first inclined surface 132, and when the expansion fixing unit 220 is inserted into the communication hole 112, the corner portion is configured to press the side surface of the expansion fixing unit 220.

As a result, when the expansion fixing unit 220 is inserted into the communication port 112, it is pressed by the first inclined surface 132, the pressing of the side surfaces increases, and can be suppressed from sliding in the opposite direction by the second inclined surface 134.

In this way, the inclined protruding unit 110 according to the present invention includes the protrusion pressing part 130 on the inner surface of the communication hole 112, thereby enabling complete sealing when inserting the expansion fixing unit 220, and suppressing detachment in the opposite direction at the same time.

Next, the inclined protruding unit 110 includes a separate decompression part 140, as shown in FIGS. 6A and 6B.

The decompression part 140 is formed along at least a part of the periphery of the inclined protruding unit 110, and when the expansion fixing unit 220 is pushed out more than a preset length inside the communication port 112 and slides in the direction of the connecting unit 230, the gas inside the container 10 is discharged to the outside.

Specifically, at least one or more decompression parts 140 are provided, are formed in the shape of a hole or a slit on the inner surface of the communication port 112 to cause the inside and the outside to communicate with each other, and are selectively exposed to the outside according to the inserted position of the expansion fixing unit 220.

At this time, as shown in FIGS. 6A and 6B, the decompression part 140 is formed in a hole-like shape in which the inside and the outside communicate at least partially along the periphery of the communication hole 112, and is formed to be open when the expansion fixing unit 220 moves backward.

In the case of FIG. 6A, when the expansion fixing unit 220 is completely inserted and fixed into the communication port 112, the outer side surface of the expansion fixing unit 220 is in the state of being in close contact with the inner surface of the communication port 112, and at this time, the communication port 112 is in a state of being blocked by the expansion fixing unit 220.

However, as shown in FIG. 6B, when a part of the expansion fixing unit 220 is unintentionally discharged to the outside of the communication port 112 with a preset length or more, the decompression part 140 is exposed to the outside, and the high pressure gas in the container 10 is discharged to the outside.

At this time, in the case of the container 10, the high pressure is maintained because the high pressure gas is supplied from the air channel. Accordingly, when the expansion fixing unit 220 slides from and is pushed out the communication port 112 over a certain length, the high pressure gas is discharged and the pressure inside the container 10 decreases.

If the decompression unit 140 does not exist, the discharge module 200 may pop out unintentionally due to the high pressure inside the container 10.

Of course, when the fixing module 300 is coupled to the inclined protruding unit 110 and the locking protrusion 113 is fastened to one end portion of the adjusting unit 320, the discharge module 200 is supported not to pop out. Even if the adjusting unit 320 is unintentionally damaged or the coupled state is released, the decompression part 140 can prevent the discharge module 200 from popping out.

In other words, if the gas pressure inside the container 10 is too high, or if the expansion fixing unit 220 is partially pushed out of the communication port 112 due to damage of the fixing module 300, by discharging the gas from the decompression part 140 to the outside so that the exhaust module 200 does not pop out, it is possible to prevent a safety accident from occurring in the user.

Further, the decompression part 140 according to the present invention may be formed in a slit shape as shown in FIG. 7.

As shown in the drawing, the decompression part 140 is recessed in a slit shape at the upper end portion of the inclined protruding unit 110, and is formed to be partially exposed and opened when the expansion fixing unit 220 slides rearward.

At this time, the decompression part 140 has a configuration designed to have substantially the similar purpose and effect to the shape of FIGS. 6A and 6B but is only different from the position thereof, and can adjust the extruded length of the expansion fixing unit 220 until the high pressure gas is discharged to the outside according to the slit-shaped length of the decompression part 140.

Also, the inclined protruding portion 110 can be formed to include both the hole shape shown in FIGS. 6A and 6B and the slit-shaped decompression portion 140 shown in FIG. 7.

As described above, the inclined protruding unit 110 according to the present invention preemptively discharges the gas inside the container 10 when the expansion fixing unit 220 is pushed out from the communication port 112 by a preset length or more through the decompression part 140. Accordingly, it is possible to prevent the discharge module 200 from unintentionally detaching due to the high pressure inside the container 10, thereby suppressing a safety accident.

While preferred embodiments of the present invention have been shown and described above, the present invention is not to be limited to the particular embodiments described above, but rather can be modified without departing from the scope of the present invention as claimed in the appended claims. It goes without saying that various modifications can be made by those who have ordinary knowledge in the technical field to which the present invention belongs, and such modifications should not be understood separately from the technical idea or perspective of the present invention.

DESCRIPTION OF SYMBOLS

10: Container
12: Housing space
100: Guide module
110: Inclined protruding unit
120: Cover unit
130: Protrusion pressing part
140: Decompression part
200: Discharge module
210: Channel unit
220: Expansion fixing unit
230: Connecting unit
300: Fixing module
310: Coupling unit
320: Adjusting unit

What is claimed is:

1. A cover device which is coupled to an opening portion of a container in which a photoresist aqueous solution is housed to seal the inside and simultaneously discharge the photoresist aqueous solution to the outside, the cover device comprising:
   a guide module which is coupled to an upper end portion of the container, has an upward inclination at a predetermined angle, has an inclined protruding unit that protrudes, and is formed with a communication port through which the inside and the outside of the housing space communicate;
   a discharge module which is formed in a long pipe shape, and in which one side along a longitudinal direction penetrates the communication port and is disposed inside the container, the other side is exposed to the outside to form a discharge port, and an intermediate portion along the longitudinal direction has an expansion fixing unit which is formed to expand, is in contact with an inner surface of the communication port on at least a part of periphery, and is inserted and fixed; and
   a fixing module which is fixedly coupled to the inclined protruding unit in a state in which the other part of the discharge module penetrates, and is formed so that the discharge module is pressed toward the guide module,
   wherein the communication port is formed to have an inner diameter that decreases toward the inside of the container in at least a partial region and is fixed by pressing.

2. The cover device according to claim 1,
   wherein the discharge module further comprises a channel unit which is formed long, has a part disposed inside the container, and has a discharge channel formed therein, and a connecting unit which protrudes to extend from the expansion fixing unit, is exposed to outside, and has a discharge port extending with the discharge channel.

3. The cover device according to claim 2,
   wherein the inclined protruding units further comprises a protrusion pressing part formed in at least a part along the inner surface of the communication port, protrudes toward the center, and comes into contact with the expansion fixing unit.

4. The cover device according to claim 3,
   wherein the protrusion pressing part is formed with a first inclined surface that protrudes at a predetermined angle along the longitudinal direction.

5. The cover device according to claim 4,
wherein the inclined protruding unit is formed with a second inclined surface, which is continuous with the first inclined surface and is inclined in an opposite direction inside the communication hole, and has a relatively larger inclination angle than the first inclined surface.

6. The cover device according to claim 2,
wherein the inclined protruding unit further comprises a decompression part which is formed in at least a part along the periphery, and when the expansion fixing unit is pushed out from the inside of the communication port by a preset length or more and slides toward the connecting unit, discharges the gas inside the container to the outside.

7. The cover device according to claim 6,
wherein the decompression part is formed in a hole shape through which inside and outside communicate in at least a part along the periphery of the communication port, and is formed to be opened when the expansion fixing unit moves rearward.

8. The cover device according to claim 6,
wherein the decompression part is formed in a slit shape at an upper end portion of the inclined protruding unit, and opened when the expansion fixing unit moves rearward.

9. The cover device according to claim 2,
wherein the fixing module comprises:
a coupling unit, through which the other part of the discharge module penetrates, and which surrounds at least a part of the inclined protruding unit in a state of being in contact with the expansion fixing unit; and
an adjusting unit which has a fixed length, and an intermediate portion fixed to the coupling unit, and in which one side along the longitudinal direction selectively comes into contact with the inclined protruding unit to adjust coupling with the coupling unit,
wherein the adjusting unit is operated to press the expansion fixing unit in the direction of the container, and the expansion fixing unit is prevented from being detached in an opposite direction.

10. The cover device according to claim 9,
wherein the inclined protrusion unit comprises a serrated locking protrusion on at least a part of the outer surface, and a plurality of protrusions are continuously formed along the protruding longitudinal direction, and
the adjusting unit is coupled to at least a part of the locking protrusion on one end portion, and is selectively fixed.

* * * * *